United States Patent [19]

Polinsky

[11] 3,898,107

[45] Aug. 5, 1975

[54] METHOD OF MAKING A JUNCTION-ISOLATED SEMICONDUCTOR INTEGRATED CIRCUIT DEVICE

[75] Inventor: Murray Arthur Polinsky, Somerville, N.J.

[73] Assignee: RCA Corporation, New York, N.Y.

[22] Filed: Dec. 3, 1973

[21] Appl. No.: 420,858

[52] U.S. Cl. ........................ 148/1.5; 357/34; 357/43

[51] Int. Cl.$^2$ .................. H01L 29/72; H01L 27/02; H01L 21/00

[58] Field of Search .................. 148/1.5; 357/34, 43

[56] References Cited

UNITED STATES PATENTS 3,547,716 12/1970 De Witt ................................ 357/34

3,609,479 9/1971 Lin ........................................ 357/43

*Primary Examiner*—Peter D. Rosenberg
*Attorney, Agent, or Firm*—H. Christoffersen; R. P. Williams

[57] ABSTRACT

Complementary insulated gate field effect transistors are made compatibly with bipolar transistors in a junction-isolated integrated circuit device by a process which includes the simultaneous redistribution of conductivity modifiers in a well region for an insulated gate field effect transistor and in the isolation regions of the device.

2 Claims, 6 Drawing Figures

METHOD OF MAKING A JUNCTION-ISOLATED SEMICONDUCTOR INTEGRATED CIRCUIT DEVICE

Figure 1:
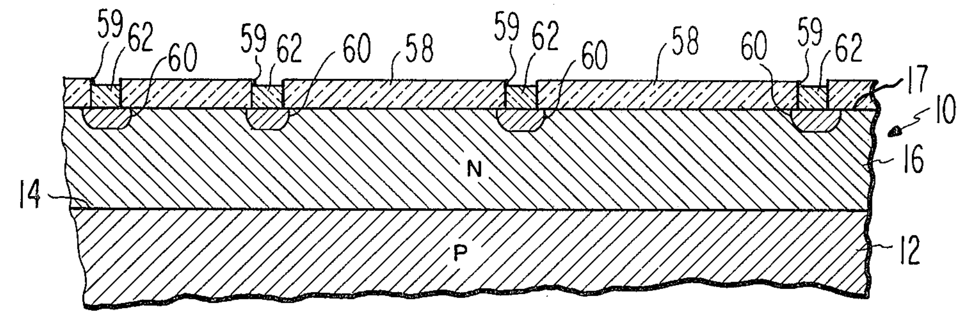

This invention relates to a method of making a junction-isolated monolithic semiconductor integrated circuit device of the type having a semiconductor body comprising a substrate of one type conductivity, a layer of material of opposite type conductivity on the substrate, and isolation regions of the one type conductivity extending through the layer to divide it into a plurality of separate islands in which the circuit elements are disposed. The invention pertains particularly to a process of making such a device so as to include as an element thereof an insulated gate field effect transistor which requires a substrate region of the same type conductivity as the main substrate, but separate therefrom.

Junction-isolated integrated circuit devices are well known. Usually these devices include one or more bipolar transistors. It has been recognized that integrated circuit devices including both insulated gate field effect transistors and bipolar transistors can provide many circuit functions which cannot be performed by insulated gate field effect transistors or bipolar transistors alone. The advantages of such devices are described in Lin et al., U.S. Pat. No. 3,609,479, issued on Sept. 28, 1971 and in applicant's Belgian Pat. No. 766,651, as examples. Also, as shown by these patents, the art has recognized the utility of integrated circuits which include complementary P channel and N channel insulated gate field effect transistors together with bipolar transistors. Fabrication difficulties have, however, impeded the realization of such devices.

Integrated circuit devices including complementary insulated gate field effect transistors have usually been made in a bulk semiconductor body of N type conductivity, which itself provides a substrate for the P channel transistors. For the N channel transistors, well regions of P type conductivity have been provided, usually by diffusion processes. Sufficient isolation between individual transistors has usually been provided by the PN junctions between the well regions and the N type substrate. In most circuits, these junctions are reverse biased by connecting the well regions to the lowest potential available in the circuit while the N type substrate is connected to the highest available potential. Devices constructed in this way are subject, however, to a latching problem owing to four-layer device action involving, for example, an N+ source region, its P type well region, the N type substrate, and a P+ source region. A structure including complementary insulated gate field effect transistors with superior isolation would find wide application.

In junction-isolated bipolar integrated circuits of the type described above, the substrate is usually P type, and the layer of opposite type conductivity is an N type epitaxial layer. The isolation zones are also P type. Isolation is provided by reverse biasing the PN junctions between the substrate and isolation regions and the separate islands in the epitaxial layer, including holding the P type substrate at the lowest available potential. These conditions are appropriate to the inclusion of complementary insulated gate field effect transistors in this kind of material in the manner disclosed in Lin et al., for example. Thus, the P type material in which an N channel insulated gate field effect transistor is formed may be the P type main substrate material itself or a P type region which is not isolated from the main substrate. There are many other circuit applications, however, where the N channel insulated gate field effect transistor should be isolated from the main P type substrate so that, for example, its P type well region may be at a higher potential than the lowest available potential. This requires a P well region which does not extend entirely through the N type epitaxial layer of the device. Lin et al. and my Belgian patent, identified above, do not disclose or suggest how such a structure may be practically achieved, for the following reasons.

I have found that to make a P well region of suitable depth and doping concentration in a junction-isolated structure requires heating the semiconductor material for times which are substantially longer than the times used to form the regions of a bipolar device in such a structure. The heating times for the isolation regions are also relatively long. In conventional practice, the isolation regions are formed prior to the formation of the device regions. If the relatively long heating steps required to form a practicable P well are performed after the isolation regions are formed, the additional diffusion, including sideways diffusion, which takes place in the isolation regions consumes valuable space within the semiconductor body. If the P well is formed prior to the formation of the isolation regions as disclosed in my Belgian patent, the additional diffusion which takes place later in the processing may drive the P well too deep for practical utility. Teachings are available in the art to the effect that the isolation regions of a junction-isolated integrated circuit device may be diffused at least in part concurrently with a diffusion used to produce a region of a circuit element of the device. See Dewitt et al., U.S. Pat. No. 3,547,716, issued Dec. 15, 1970, for example. How such techniques may be applied to form a well region of practicable structure for an insulated gate field effect transistor together with isolation regions in a junction-isolated device which includes insulated gate field effect transistors is not disclosed or suggested, however.

In the drawings:

FIGS. 1 to 6 are a sequence of cross-sectional views illustrating the present novel method.

Figure 6:
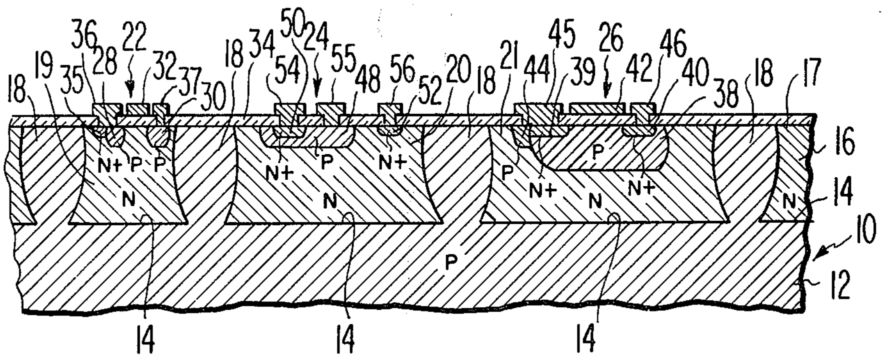

FIG. 6 illustrates the partial cross-sectional structure of an integrated circuit device 10 of the kind which can be prepared by the present novel processes. In the embodiment shown in FIG. 6, the device 10 includes a P type substrate 12 which has an upper boundary 14 on which is disposed an epitaxial layer 16 of semiconductive material of N type conductivity. See FIGS. 1 and 2. The layer 16 has a surface 17 spaced from and substantially parallel to the boundary 14 of the substrate 12. Isolation regions 18 extend through the epitaxial layer 16 from the surface 17 thereof to the boundary 14 of the substrate 12 to separate the layer 16 into a plurality of separate islands, 19, 20, and 21 in this example. This structure is like the structure found in many junction-isolated bipolar circuits.

In the device 10, as shown, there are three different active elements. Formed in the island 19 is a P channel insulated gate field effect transistor 22. A bipolar transistor 24 is contained in the island 20. An N channel insulated gate field effect transistor 26 has regions formed within the island 21.

The P channel insulated gate field effect transistor 22 has spaced source and drain regions 28 and 30, respectively, formed adjacent to the surface 17 of the layer 16 and defining the ends of a charge carrier channel. A gate electrode 32 overlies the space between the source and drain regions 28 and 30 and is separated therefrom by an insulator. The insulator may be part of an insulating layer 34 disposed on the surface 17 of the layer 16. An N+ type zone 35 may be disposed adjacent to the source region 28 to enable the source region 28 to be conveniently electrically connected to the material of the island 19. A source contact electrode 36 overlies and contacts both the source region 28 and the N+ type zone 35. A drain contact electrode 37 contacts the drain region 30 of the transistor 22.

The N channel insulated gate field effect transistor 26 includes a P well region 38 in the island 21. Within the P well region 38 are spaced source and drain regions 39 and 40, respectively, of N+ type conductivity, and over the space between these regions is a gate electrode 42 which is separated from the layer 16 by an insulator which again may be part of the insulating layer 34. A P type zone 44 may be disposed adjacent to the source region 39 and to the well region 38 to enable the source region 39 to be conveniently connected to the well region 38 by means of a source contact electrode 45, which overlies and contacts both the source region 39 and the P type region 44. The transistor 26 also includes a drain contact electrode 46 in contact with the drain region 40.

The bipolar transistor 24 is of conventional construction. It includes a P type base region 48 disposed within the island 20 and an N+ type emitter region 50 disposed within the base region 48. The original N type material of the island 20 constitutes the collector region of the transistor 24. An N+ type collector contact region 52 may be provided. Emitter, base, and collector contacts 54, 55, and 56 are provided to connect the transistor 24 to other elements in the device.

The structure of FIG. 6 is made, in the present novel process, by a sequence of steps, some of which are illustrated in FIGS. 1 to 6. Many conventionally practiced steps of cleaning, photolithographically, etc., are not illustrated, for clarity. Referring to FIG. 1, the early steps in the present novel process are as follows. A silicon wafer, having a surface substantially parallel to its [100] planes, of which the illustrated structure of the device 10 is a part, is first provided with the epitaxial layer 16 by conventional processes. The conditions of the epitaxial growth process are adjusted in known fashion to produce material having a resistivity of about 3 to about 6 ohm-centimeters in the present example. The thickness of the layer 16 is preferably in the range of 12 to 14 micrometers.

After the formation of the layer 16, the isolation regions 18 are partially formed. For this purpose a masking oxide layer 58 is formed on the surface 17, preferably by thermally oxidizing a portion of the layer 16. It will be understood that thermal oxidation steps of this kind consume part of the material of the semiconductor body so that each oxidation produces a new boundary within the semiconductor material. For convenience in illustration, the surface of the layer 16 will be designated as the surface 17 throughout the figures. The oxide layer 58 may be formed, for example, by heating the device 10 in an oxidizing atmosphere, such as steam, to a temperature of about 1,165°C for a period of about 50 minutes. Conventional photolithographic processes are then applied to form openings 59 in the oxide layer 58 in the pattern desired for the isolation regions. Then, conventional deposition processes are performed to provide adjacent to the surface 17 a source of P type conductivity modifiers, boron in this example, which, because of the masking effect of the oxide layer 58, are in the pattern of the isolation regions. The deposition conditions are selected, in this example, to provide a surface concentration of modifiers high enough to have a sheet resistivity of about 3 ohms per square at this stage of the process.

The next step in the present process is to partially redistribute the conductivity modifiers for the isolation regions 18, if necessary, to produce PN junctions 60 (FIG. 1) within the layer 16 at a depth less than the desired depth for the isolation regions. This is accomplished by heating the device 10 for a time which is substantially less than the time which would ordinarily be required to diffuse these conductivity modifiers all the way through the layer 16 to the substrate 12 to form the isolation regions 18. The conditions are selected such that the PN junctions 60 are formed at a depth less than the desired depth for the isolation regions 18 by an amount which is equal to the distance through which the isolation regions would otherwise further diffuse if the heating of the device 10 were continued at the predetermined temperature and predetermined time, which will be described below, used for the formation of the P well region 38 of the transistor 26. For example, for the above-mentioned surface concentration of conductivity modifiers produced during the deposition step for the isolation regions, the total time required to form the isolation regions might be 5 hours at a temperature of 1,200°C. A typical time for the redistribution of modifiers in the P well region 38 might be 3 hours at 1,200°C. Consequently, the initial heating step to form the PN junctions 60 should then be carried out for 2 hours. This step should be carried out in an oxidizing atmosphere, such as dry oxygen, as in conventional practice, with the result that the openings 59 in the layer 58 are closed by the oxidation of the surface 17 of the layer 16 to form additional oxide layers 62.

Figure 2:
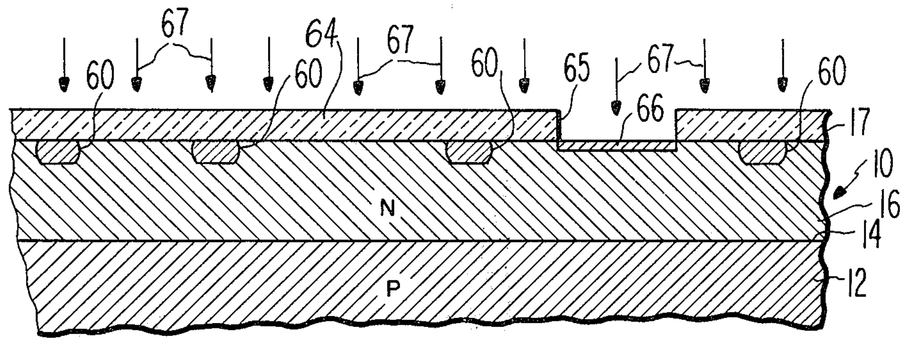

The next step in the present process is to remove the oxide layers 58 and 62 and to produce on the surface 17 a new masking oxide coating 64 (FIG. 2). This oxide coating 64 may be produced by heating the device 10 in steam under the same conditions as given above for the formation of the coating 58. Photolithographic processes are then used to form openings 65 in the coating 64 in the pattern of the well regions in the device. Only one such opening 65 is shown in FIG. 2.

A source of P type conductivity modifiers, boron for example, is next formed adjacent to the surface 17 in the pattern of the well regions. This source of modifiers is shown in FIG. 2 as a shallow region 66. Preferably, the region 66 is formed by processes of ion implantation, the details of which are generally known in the art. In the present example, the device 10 is placed in a conventional ion implantation apparatus and boron ions are accelerated toward the device, as suggested by the arrows 67 in FIG. 2, with an energy of about 100 KEv to provide a dose of boron amounting to about $2.4 \times 10^{13}$ atoms/cm$^2$ through the surface 17.

Figure 3:
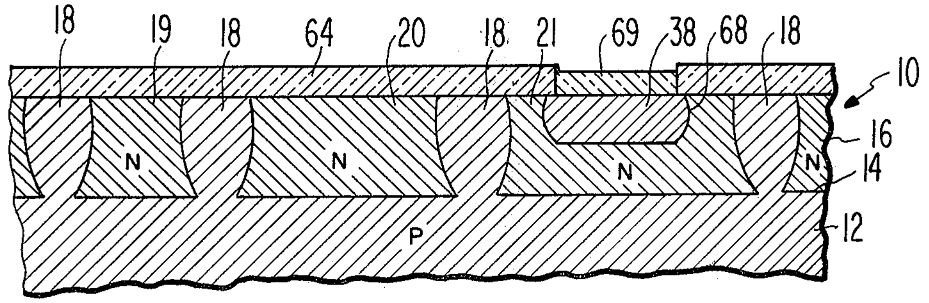
Figure 4:
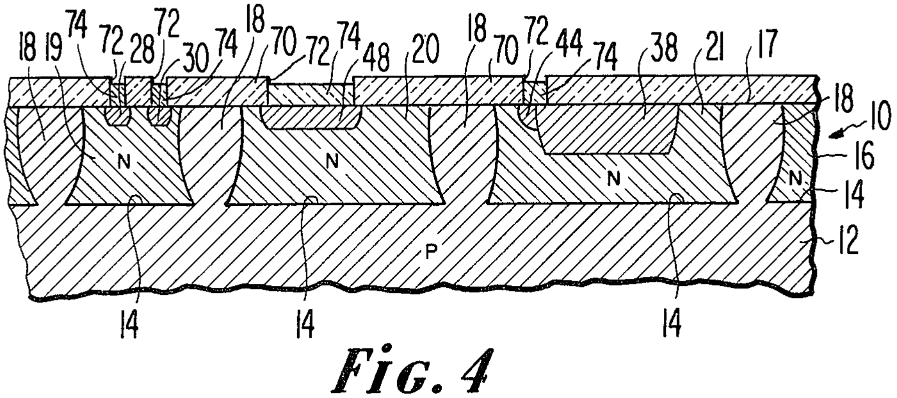
Figure 5:
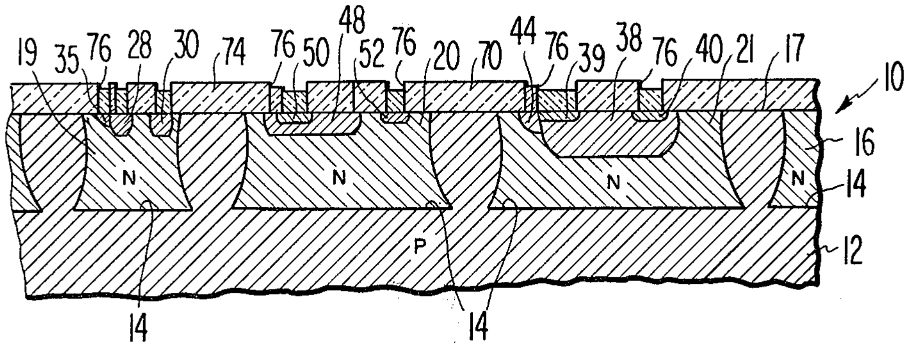

The device 10 is next heated to redistribute the boron atoms from the region 66 to form the P well region 38 bounded by a PN junction 68 (FIG. 3) at a desired depth within the layer 16. With the conditions so far established in this example, this redistribution step, if carried out for three hours at 1,200°C, will drive the junction 68 to a depth of about five micrometers within the layer 16 and produce a sheet resistivity of about 1,400 ohms per square. Simultaneously, the conductivity modifiers previously introduced to form the isolation regions 18 will be redistributed through the layer 16, and the final result will be as shown in FIG. 3. This process is also carried out in an oxidizing atmosphere, thereby closing the aperture 65 in the layer 64 with an oxide coating 69.

By the completion of the isolation regions, the layer 16 is divided into the separate islands 19, 20, and 21. It will be understood by those of ordinary skill that some further diffusion of both the regions 18 and the well region 38 will take place during further processing, so that in the design of the present process the diffusion times given are proportionately less than the total time required to form these regions.

From this point, processing is generally conventional. In particular, the oxide coatings 64 and 69 are next removed; a new oxide coating 70 (FIG. 4) is formed; and openings 72 are defined therein by conventional photolithographic processes. The openings 72 are formed in the pattern desired for the bases of bipolar transistors and for the sources and drains of P channel insulated gate field effect transistors in the device. Other regions may similarly be formed during this step, including diffused resistors, if desired, and P well contact regions like the region 44 of FIG. 6. Then a conventional deposition and redistribution process is employed to diffuse boron into the layer 16 to provide in this example the source and drain regions 28 and 30, the base region 48, and the P well contact region 44. Typically, the surface concentration of the deposition is such that the sheet resistivity is about 48 ohms per square, and the redistribution step is carried out first in steam at a temperature of about 1,000°C for a period of about 70 minutes and then in dry oxygen at about 1,200°C for about 45 minutes. This introduces the junctions bounding these regions to a depth of about 3.3 micrometers. During this processing, a new oxide coating 74 is formed in the openings 72. Openings 76 are next photolithographically defined after which a deposition and redistribution of phosphorus is performed, in conventional manner. For example, the device 10 may be heated to about 1,050°C, exposed to a source of phosphorus, such as phosphorus oxychloride, for about 10 minutes, and then heated at the same temperature for an additional 35 minutes in the absence of the phosphorus source. This procedure forms junctions at a depth of about 2.5 micrometers. This process forms the emitter 50 and the collector contact region 52 of the transistor 24, the source and drain regions 39 and 40 of the transistor 26, and the contact region 35 of the transistor 22. At this point the formation of the several regions within the device 10 is complete.

The masking oxide coating 74 is next removed, and the device is completed by forming the final oxide coating 34, photolithographically defining contact openings therein, and then forming the contacts to the various regions of the device by conventional contact metal evaporation and definition processes. While only silicon has been disclosed as the semiconductor material, with boron and phosphorus as the dopants, those of ordinary skill will understand that these are the commonly used materials in the art and that the invention as claimed hereinafter is not limited to these materials.

By simultaneously redistributing the modifiers in the well region 38 of the transistor 26 and the isolation regions 18 in the manner described above, the following advantageous results are obtained. First, the well region 38 is diffused to an optimum depth, isolated from the substrate, and the isolation regions are not unduly enlarged. Practical isolated CMOS or CMOS/Bipolar devices free of the latching problem and capable of use in many new circuit designs can, therefore, be realized.

What is claimed is:

1. A method of making a junction-isolated integrated circuit device which includes a body of semiconductive material comprising a substrate of one type conductivity, a layer of semiconductor material of opposite type conductivity and of predetermined thickness on said substrate, isolation regions of said one type conductivity extending through the thickness of said layer to divide it into a plurality of separate regions, and an insulated gate field effect transistor comprising a well region of said one type conductivity formed in one of said separate regions and spaced source and drain regions of said opposite type conductivity in said well region, said well region being formed in part by diffusion from a source of conductivity modifiers of predetermined initial concentration at a predetermined temperature and for a predetermined time such that it extends to a predetermined depth within said layer less than the thickness of said layer, said method comprising:

forming adjacent to a surface of said layer a source of conductivity modifiers of said one type, in the pattern of said isolation regions, heating said body to redistribute said conductivity modifiers into said body to form a PN junction at a depth less than the desired depth for said isolation regions by an amount substantially equal to the distance through which the isolation regions will further diffuse at said predetermined temperature and predetermined time used for the formation of said well region, thereafter forming adjacent to said surface of said body a source of conductivity modifiers of said one type in said predetermined concentration for said well regions, and reheating said body to said predetermined temperature for said predetermined time to simultaneously redistribute the conductivity modifiers in both said isolation regions and said well region to the desired depth for each.

2. A method of making an integrated circuit device as defined in claim 1, wherein said body is silicon, said layer is of N type conductivity, and said conductivity modifier source forming step for said well region is performed by ion-implanting boron atoms into said layer.

* * * * *